United States Patent [19]

Hirata

[11] 4,433,308
[45] Feb. 21, 1984

[54] PLL DETECTION CIRCUIT

[75] Inventor: Hitoshi Hirata, Tokyo, Japan

[73] Assignee: Pioneer Electronic Corporation, Tokyo, Japan

[21] Appl. No.: 326,994

[22] Filed: Dec. 3, 1981

[30] Foreign Application Priority Data

Dec. 8, 1980 [JP] Japan .............................. 55-176020[U]

[51] Int. Cl.³ .............................................. H03L 7/08
[52] U.S. Cl. ........................................ 331/17; 331/25;
331/DIG. 2; 307/522; 307/257; 307/321
[58] Field of Search ...................... 307/321, 257, 522;
331/17, 25, 26, 28

[56] References Cited

U.S. PATENT DOCUMENTS

| 2,932,793 | 4/1960 | Smith et al. | 307/321 |
| 3,127,564 | 3/1964 | Giger | 307/321 |
| 3,363,194 | 1/1968 | Hileman | 331/17 |
| 3,771,063 | 11/1973 | Barrett | 307/321 |
| 3,777,181 | 12/1973 | Bancroft | 307/321 |
| 3,903,473 | 9/1975 | Foster | 331/26 |
| 3,993,958 | 11/1976 | Cutsogeorge | 331/25 |
| 4,007,429 | 2/1977 | Cadalora et al. | 331/25 |

Primary Examiner—John S. Heyman
Attorney, Agent, or Firm—Sughrue, Mion, Zinn, Macpeak & Seas

[57] ABSTRACT

A time constant resistor in a phase lock loop filter is short-circuited by a plurality of diodes which are activated in response to a detection output indicating that the filter output is within a desired locking range.

4 Claims, 3 Drawing Figures

PLL DETECTION CIRCUIT

BACKGROUND OF THE INVENTION

This invention relates to a PLL (phase locked loop) detection circuit.

FIG. 1 is a circuit diagram showing a conventional PLL detection circuit. In FIG. 1, a predetermined signal ei is applied to one input terminal of a phase comparator 1, to the other input terminal of which the oscillation output of a VCO (voltage-controlled oscillator) 2 is applied. Thus, the phase comparator provides an output according to the difference in frequency and phase between the oscillation output and the FM input signal ei. The output of the phase comparator 1 is converted into a DC voltage by a loop filter 3. The DC voltage, after being amplified by a DC amplifier 4, becomes a detection output, and is applied, as a control voltage, to the VCO 2.

The loop filter 3, for instance, comprises: a resistor $R_1$ is connected between the output terminal of the phase comparator 1 and the input terminal of the DC amplifier 4; and a series circuit of resistors $R_2$ and $R_3$ and a capacitor, which is connected between the output terminal of the resistor $R_1$ and ground. A transistor $Q_0$ is connected in parallel with the resistor $R_3$. In response to a control signal $V_B$ which is produced when a turning point is substantially detected, the transistor $Q_0$ short-circuits the resistor $R_3$, to change the time constant of the loop filter 3, to thereby make the filter characteristic narrow and to reduce the lock-in time. In providing the PLL detection circuit in the form of an integrated circuit, the capacitor $C_1$ is externally connected to a terminal (or a pin) A.

In the PLL detection circuit thus organized, the time constant of the loop filter 3 is changed by the switching operation of the transistor $Q_0$. However, this method is disadvantageous in that, when the transistor $Q_0$ is employed as the switching element, a DC offset voltage occurs which produces spike noise and makes the PLL loop unstable.

SUMMARY OF THE INVENTION

Accordingly, an object of this invention is to provide a PLL detection circuit in which the above-described difficulties have been eliminated by suppressing the occurrence of the offset voltage in switching the time constant of the loop filter.

A specific feature of the PLL detection circuit according to this invention resides in that the time constant of the loop filter is changed by a diode switch circuit which comprises: first and second diodes the cathodes of which are connected respectively to both ends of at least one of the elements which defines a time constant for the loop filter, with the anodes thereof connected to each other; third and fourth diodes the anodes of which are connected respectively to the two ends of the element, with the cathode thereof connected to each other; and means for activating the first through fourth diodes in response to a predetermined signal.

BRIEF DESCRIPTION OF THE DRAWINGS

One embodiment of this invention will be described with reference to the accompanying drawings, in which.

DETAILED DESCRIPTION OF THE PREFERRED EMBODIMENTS

Figure 1:
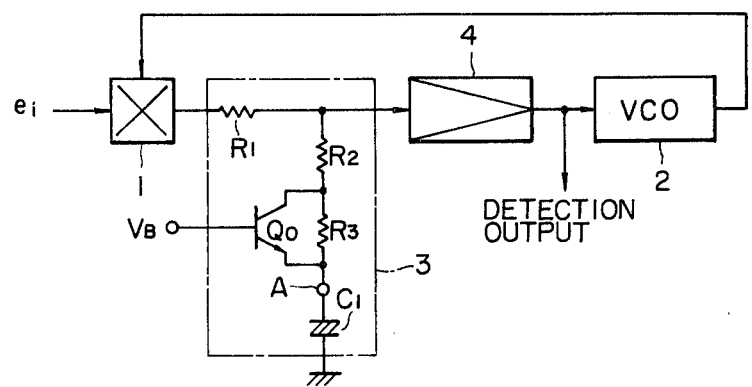
FIG. 1 is a circuit diagram showing a conventional PLL detection circuit.
Figure 2:
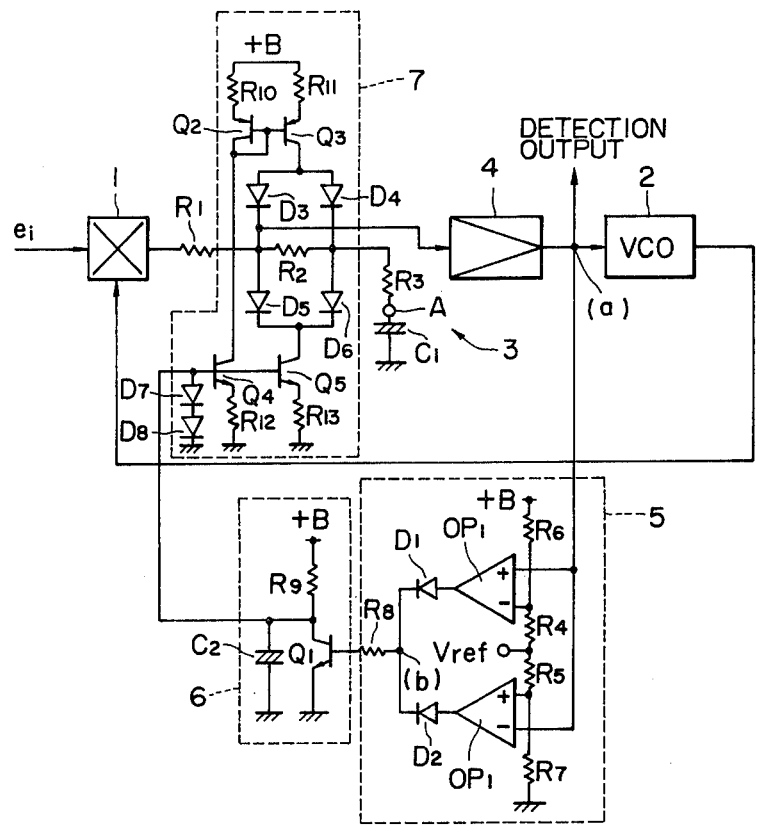
FIG. 2 is a circuit diagram showing one example of a PLL detection circuit according to this invention.

FIG. 2 is a circuit diagram showing an embodiment of this invention. In FIG. 2, those elements which have been described with reference to FIG. 1 are therefore designated by the same reference numerals or characters. In FIG. 2, reference numeral 5 designates a zero volt switch circuit which detects when the output of the switch filter 3 amplified by the DC amplifier 4, i.e., when the detection output is in a predetermined level range, at which time it provides a detection signal. Thus, the zero volt switch circuit is a type of window comparator. The circuit 5 comprises an operational amplifier $OP_1$ which receives the detection output through its non-inversion input terminal; and an operational amplifier $OP_2$ which receives the detection output through its inversion input terminal. A reference voltage $V_{ref}$ is applied to the inversion input terminal of the operational amplifier $OP_1$ and the non-inversion input terminal of the operational amplifier $OP_2$, respectively, through resistors $R_4$ and $R_5$. The inversion input terminal of the amplifier $OP_1$ is connected through a resistor $R_6$ to a power source $+B$, and the non-inversion input terminal of the amplifier $OP_2$ is grounded through a resistor $R_7$. The outputs of the operational amplifiers $OP_1$ and $OP_2$ are applied through diodes $D_1$ and $D_2$ and a resistor to a delay circuit 6. The delay circuit 6 comprises a transistor $Q_1$, a resistor $R_1$ and a capacitor $C_2$. The output of the delay circuit 6 is applied to a diode switch circuit 7 adapted to change the time constant of the loop filter 3.

The diode switch circuit 7 comprises first and second diodes $D_3$ and $D_4$ the cathodes of which are connected to both ends of at least one of the elements defining the time constant of the loop filter 3 (which is for instance the resistor $R_2$), with the anodes being connected together; third and fourth diodes $D_5$ and $D_6$ the anodes of which are connected to both ends of the resistor $R_2$, with the cathodes being connected together; and a current mirror circuit for activating these diodes $D_3$ through $D_6$ in response to the output of the delay circuit 6. The current mirror circuit comprises a diode-connected transistor $Q_2$; a transistor $Q_3$ having its base connected to the base of the transistor $Q_2$ and having its collector connected to the connecting point of the anodes of the diodes $D_3$ and $D_4$; a transistor $Q_4$ having its collector connected to the collector of the transistor $Q_2$ and receiving the ouptut of the delay circuit 6 through its base; and a transistor $Q_5$ having its base connected to the base of the transistor $Q_4$ and having its collector connected to the connecting point of the cathodes of the diodes $D_5$ and $D_6$. The emitters of the transistors $Q_2$ and $Q_3$ are connected respectively through resistors $R_{10}$ and $R_{11}$ to the power source $+B$, and the emitters of the transistors $Q_4$ and $Q_5$ are grounded respectively through resistors $R_{12}$ and $R_{13}$. The base of the transistor $Q_4$ is grounded through diodes $D_7$ and $D_8$.

Figure 3A:
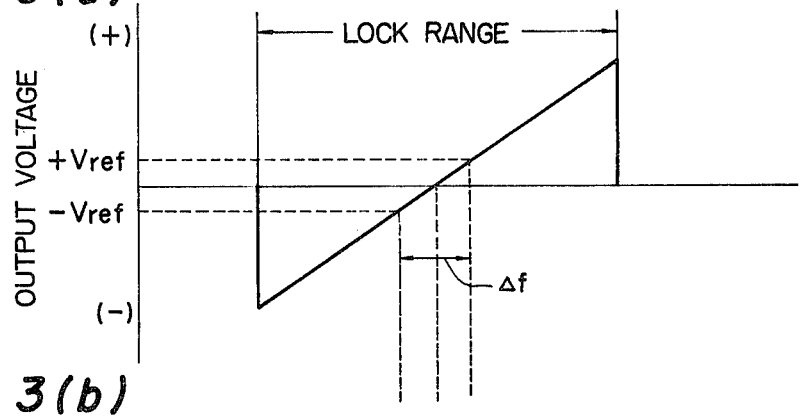
FIG. 3(a) is a waveform diagram showing a detection output.
Figure 3B:
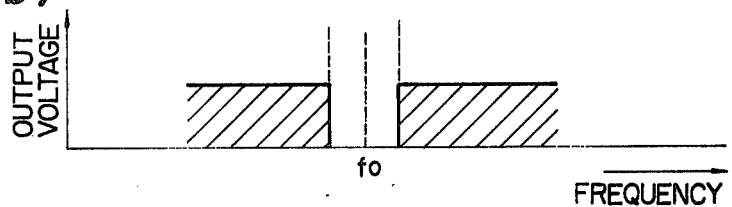
FIG. 3(b) is a waveform diagram showing the output of a zero volt switch circuit in FIG. 2.

When, in the circuit thus organized, the frequency of the input signal ei is gradually swept and the input signal ei comes within the locking range of the PLL detection circuit, the PLL detection circuit is readily locked since the filtering characteristic of the PLL detection circuit is of a wide band. FIGS. 3(a) and 3(b) show the waveform of the detection output and the waveform of the output of the zero volt switch circuit 5, respectively. If the frequency of the input signal ei is out of the band $\Delta f$, then the detection output level is out of the range of from $-V_{ref}$ to $+V_{ref}$, and therefore the zero volt switch circuit 5 produces a high level output. Since this output is applied through the delay circuit to the diode switch circuit 7, the current mirror circuit is placed in an "off" state, and accordingly the diodes $D_3$ through $D_6$ are placed in "non-active" states. Accordingly, the resistor $R_2$ is not short-circuited, and therefore the time constant of the loop filter 3 is defined by the resistors $R_1$ through $R_3$ and the capacitor $C_1$ and the wide band filtering characteristic of the PLL is maintained unchanged.

When the input signal ei comes within the band $\Delta f$, the detection output level is in the range of from $+V_{ref}$ to $-V_{ref}$, and therefore the zero volt switch circuit 5 provides a low level output. In response to the low level output, the current mirror circuit in the diode switch circuit 7 is placed in an "on" state, and therefore the diodes $D_3$ through $D_6$ are activated. As a result, the resistor $R_2$ is short-circuited, and therefore the time constant of the loop filter 3 is defined now by the resistors $R_1$ and $R_3$ and the capacitor $C_1$. In this case, the PLL filter characteristic is of a narrow band. By further sweeping the input signal ei, the aforementioned wide band state is again obtained.

Since the time constant of the loop filter is changed by the operation of the diodes ($D_3$ through $D_6$), the PLL filter characteristic can be changed without generating an offset voltage.

The time constant of the loop filter may be changed by switching a plurality of capacitors. However, if this method is employed, and the PLL detection circuit is manufactured in the form of an integrated circuit, the number of terminals (or pins) of the integrated circuit must be increased because the number of capacitors which are externally connected thereto is increased. However, if the circuit according to this invention is employed, the number of such terminals is only one in correspondance to the capacitor $C_1$. The PLL detection circuit according to this invention can be suitably applied to an AM-FM stereo system AM receiver.

What is claimed is:

1. A phase lock loop detection circuit of the type comprising a loop filter having a time constant determined by a plurality of elements, means for detecting when an output of said loop filter is in a predetermined level range and providing a detection signal, and a switch circuit for changing a time constant of said loop filter in response to said detection signal, the improvement characterized in that said switch circuit comprises:

first and second diodes having cathodes which are connected respectively to both ends of at least one of said elements and anodes which are connected together;

third and fourth diodes having anodes which are connected respectively to said both ends of said one element, and cathodes connected together; and activating means for activating said first, second, third and fourth diodes in response to said detection signal.

2. A phase lock loop detection circuit as claimed in claim 1; wherein said activating means comprises a current mirror circuit having first and second current paths, said first current path conducting in response to said detection signal and said second current path being connected in series with said diodes.

3. A phase lock loop detection circuit as claimed in claim 1, further comprising delay means between said means for detecting and said activating means for delaying the operation of said activating means in response to said detection signal.

4. A phase lock loop detection circuit as claimed in claim 1, wherein said output of said loop filter is taken from the cathode of one of said first and second diodes.

* * * * *